(12) United States Patent
Kerber et al.

(10) Patent No.: US 7,880,236 B2
(45) Date of Patent: Feb. 1, 2011

(54) SEMICONDUCTOR CIRCUIT INCLUDING A LONG CHANNEL DEVICE AND A SHORT CHANNEL DEVICE

(75) Inventors: Andreas Kerber, White Plains, NY (US); Kingsuk Maitra, Guilderland, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 357 days.

(21) Appl. No.: 12/181,180

(22) Filed: Jul. 28, 2008

(65) Prior Publication Data

US 2010/0019313 A1    Jan. 28, 2010

(51) Int. Cl.
*H01L 29/66* (2006.01)
(52) U.S. Cl. .......... 257/365; 257/327; 438/283
(58) Field of Classification Search ............ 257/365, 257/327; 438/283
See application file for complete search history.

(56) References Cited

U.S. PATENT DOCUMENTS

| | | | |
|---|---|---|---|
| 5,952,696 | A | 9/1999 | Gardner et al. |
| 6,620,713 | B2 | 9/2003 | Arghavani et al. |
| 7,153,784 | B2 | 12/2006 | Brask et al. |
| 7,297,587 | B2 | 11/2007 | Wu et al. |
| 2004/0256692 | A1 | 12/2004 | Kunz et al. |
| 2006/0051924 | A1 | 3/2006 | Doczy et al. |

FOREIGN PATENT DOCUMENTS

EP    1020921 A2    12/1999

OTHER PUBLICATIONS

E. Cartier et al., "Role of oxygen vacancies in VFB/Vt stability of pFET metals on HfO2," VLSI Technology, Digest of Technical Papers, Jun. 14-16, 2005, pp. 230-231.
Guha et al., "Oxygen Vacancies in High Dielectric Constant Oxide-Semiconductor Films," The American Physical Sockiey, Physical Review Letters, week ending May 11, 2007, pp. 196101-1-196101-4.

*Primary Examiner*—Douglas M Menz
(74) *Attorney, Agent, or Firm*—Ingrassia Fisher & Lorenz, P.C.

(57) ABSTRACT

A semiconductor circuit is provided that includes a short channel device, and a long channel device that is electrically isolated from the short channel device. The long channel device comprises a plurality of first gate electrodes, a first source region adjacent one of the plurality of first gate electrodes, a first drain region adjacent another of the plurality of first gate electrodes, and a plurality of common source/drain regions positioned between adjacent ones of the plurality of first gate electrodes. The first gate electrodes each overlie portions of a layer of high-dielectric constant (k) gate insulator material. Each of the first gate electrodes are electrically coupled to at least one of the other first gate electrodes.

18 Claims, 10 Drawing Sheets

SEMICONDUCTOR CIRCUIT INCLUDING A LONG CHANNEL DEVICE AND A SHORT CHANNEL DEVICE

TECHNICAL FIELD

The present invention generally relates to semiconductor devices and to methods for their fabrication, and more particularly relates to a semiconductor circuit including a long channel device and a short channel device.

BACKGROUND

The majority of present day integrated circuits (ICs) are implemented by using a plurality of interconnected field effect transistors (FETs), also called metal oxide semiconductor field effect transistors (MOSFETs). A MOSFET device includes a gate structure that is interposed between a pair of spaced apart source and drain electrodes formed in and/or on the semiconductor substrate. The gate structure includes a gate electrode that is formed overlying a gate oxide layer, which serves as insulator between the gate electrode and a channel defined between the source and drain electrodes. The length of the channel is equal to the distance between the source and drain electrodes. The gate electrode serves as a control electrode that controls the flow of a current through the channel based on a control voltage ($V_G$) applied to the gate electrode. When the control voltage ($V_G$) applied to the gate electrode exceeds a threshold voltage ($V_{th}$) an electrical field is generated that causes a drive current to flow along the channel between the source and drain electrodes.

In many conventional MOSFETs, the gate electrode is formed of polysilicon and the gate oxide layer is formed of silicon dioxide ($SiO_2$). Although highly-doped polycrystalline silicon is an acceptable gate electrode material, it is well-known that polysilicon is not an ideal conductor since it is much more resistive than metal, which reduces the signal propagation speed through the material. It is desirable that the gate oxide layer be made thin to increase the channel conductivity and performance when the transistor is on and to reduce sub-threshold leakage when the transistor is off. As device dimensions continue to shrink in an effort to pack more devices within a given layout area, the dimensions of the gate structure also shrink. One challenge that has arisen with the continued scaling of MOSFET devices relates to limitations on the thickness of the gate oxide layer particularly when it is made from $SiO_2$. For example, as thickness of the $SiO_2$ gate oxide layer decreases, gate oxide leakage increases. As devices are made smaller and thickness of the gate oxide layer decreases, carriers will eventually tunnel from the channel through the gate oxide layer and to the gate electrode. Thus, as new generations of integrated circuits and the MOSFETs that are used to implement those ICs are designed, technologists must rely heavily on non-conventional elements to boost device performance. Examples of such non-conventional elements include gate structures constructed using "high-dielectric constant (k) gate dielectrics" with "metal" gate electrodes.

High-k materials generally refer to materials with a dielectric constant (k) greater than that of silicon dioxide. In general, the dielectric constant (k) of a particular material is a measure of how much charge the particular material can hold. Capacitance of a material is proportional to its dielectric constant (k) and inversely proportional to dielectric thickness. Increasing the dielectric constant (k) of the gate dielectric allows for a thicker layer of material to be used while maintaining the same capacitance yet improving resistance to leakage currents. Therefore use of a higher dielectric constant (k) material can increase capacitance of the transistor, which improves the transistor's performance. Thus, as an alternative to the conventional $SiO_2$ gate oxide layer, high-k gate dielectrics can be used to form the gate oxide layer of a transistor. A material with a higher dielectric constant allows the gate insulator to be made thicker than when a conventional $SiO_2$ gate oxide layer is used, and a thicker gate insulator tends to reduce the resulting leakage current. Examples of common "high-k" materials include hafnium dioxide ($HfO_2$), zirconium dioxide ($ZrO_2$) and titanium dioxide ($TiO_2$), and group IVb metal silicates such as hafnium and zirconium silicates.

Although a conventional polysilicon gate electrode can be used in conjunction with a high-k dielectric gate oxide, the combination of a high-k dielectric and a polysilicon gate electrode is not suitable for high performance logic applications. The resulting high-k/polysilicon transistors have high threshold voltages and degraded channel mobility, and hence poor drive current performance. Thus, instead of using polysilicon gate electrodes in conjunction with high-k dielectrics, metal gate electrodes, such as tantalum, tungsten, tantalum nitride, and titanium nitride, can be used to screen surface phonon scattering in high-k dielectric material and thereby improve channel mobility. The particular metal used to form the gate electrode varies depending on the particular high-k dielectric that is used for the gate oxide layer. The particular metal or metals selected for the metal gate electrode should have an appropriate work function to provide a desired threshold voltage, alleviate mobility degradation problems, and enable high-performance high-k/metal gate transistors with low gate dielectric leakages.

One issue that can arise with the use of high-k dielectric gate oxides relates to altering or changing the threshold voltage ($V_{th}$) of the MOSFET device. For example, oxygen vacancy sites within a high-k dielectric gate oxide can act as fixed positive charges that alter the electrostatic potential at the surface of the silicon layer that defines transistor channel. These fixed positive charges affect the threshold voltage ($V_{th}$) of the MOSFET device. For instance, in a PMOSFET device, the presence of the fixed positive charges (oxygen vacancy sites), requires that a greater negative gate voltage ($-V_G$) be applied to the metal gate electrode to attract holes and create a channel in which majority carrier holes can flow. In other words, the oxygen vacancy sites effectively increase the threshold voltage ($V_{th}$) of the PMOSFET device (i.e., make it more negative).

To decrease the threshold voltage ($V_{th}$) of the PMOSFET, "lateral oxidation" techniques can be used to laterally diffuse oxygen, which is present near the edges of the gate electrode, along the channel underneath the gate electrode. The diffused oxygen fills oxygen vacancy sites thereby eliminating them. Since less oxygen vacancy sites or "fixed positive charges" remain along the channel, less gate voltage ($V_G$) has to be applied to the gate electrode to offset any remaining fixed positive charges thereby lowering the threshold voltage ($V_{th}$) (i.e., making the threshold voltage ($V_{th}$) more positive).

It is desirable to provide an improved MOSFET devices which include gate structures constructed using a high-dielectric constant (k) gate dielectric with a metal gate electrode and methods for fabricating such MOSFET devices to have appropriate threshold voltages. For example, it is desirable to provide such an improved MOSFET device in which the number of oxygen vacancy sites is reduced and in which the distribution of oxygen vacancy sites is substantially uniform along the entire length of the channel. Furthermore, other desirable features and characteristics of the present invention will become apparent from the detailed description and the appended claims, taken in conjunction with the accompanying drawings and the foregoing technical field and background.

BRIEF SUMMARY

In accordance with one embodiment, a semiconductor circuit is provided that includes a short channel device, and a long channel device that is electrically isolated from the short channel device. The long channel device comprises a plurality of first gate electrodes, a first source region adjacent one of the plurality of first gate electrodes, a first drain region adjacent another of the plurality of first gate electrodes, and a plurality of common source/drain regions positioned between adjacent ones of the plurality of first gate electrodes. The first gate electrodes each overlie portions of a layer of high-dielectric constant (k) gate insulator material. Each of the first gate electrodes are electrically coupled to at least one of the other first gate electrodes.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

Figure 1:
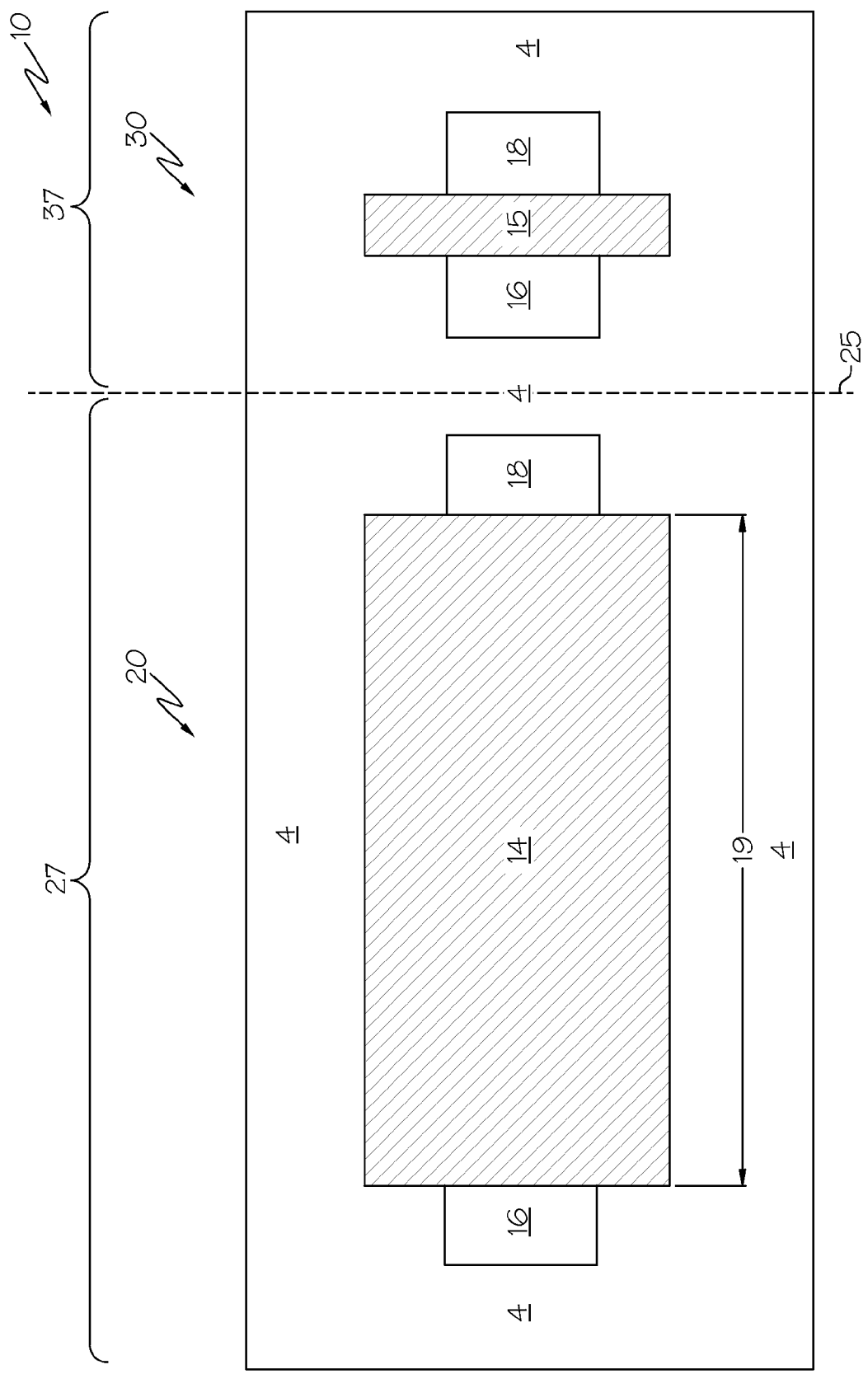
FIG. 1 illustrates, in plan view, a conventional semiconductor circuit including a long channel MOSFET device and a short channel MOSFET device.
Figure 2:
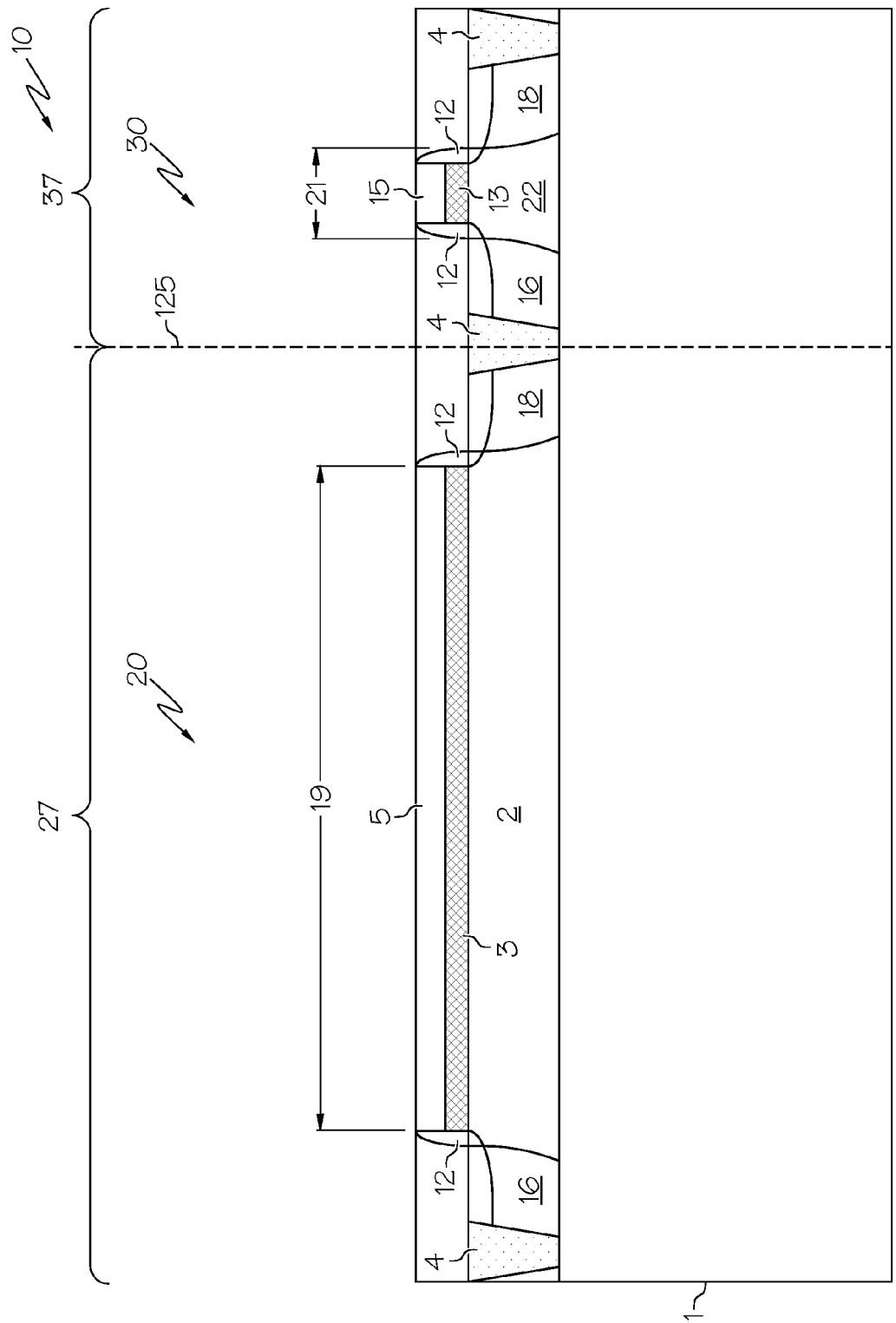
FIG. 2 illustrates, in cross section, the conventional semiconductor circuit of FIG. 1.

FIG. 1 illustrates, in plan view, a conventional semiconductor circuit 10 including a long channel MOSFET device 20 and a short channel MOSFET device 30. FIG. 1 will be described with reference to FIG. 2 that illustrates the conventional semiconductor circuit 10 of FIG. 1 in cross section. The long channel MOSFET device 20 and the short channel MOSFET device 30 are formed in and on a semiconductor substrate 1. The vertical dashed line 25 that is illustrated in FIGS. 1 and 2 indicates that the semiconductor circuit 10 includes two sections 27, 37. The first section 27, to the left of the vertical dashed line 25, includes a portion of the semiconductor substrate 1 that is used to fabricate the long channel MOSFET device 20, whereas the second section 37, to the right of the vertical dashed line 125, includes a portion of the semiconductor substrate 22 that is used to fabricate the short channel MOSFET device 30. The semiconductor substrate 1 includes isolation regions 4 for electrically isolating the devices 20, 30 from other devices formed in and on the substrate 1. The terms "long channel" and "short channel" are relative terms, but as used herein, the term "short channel" can refer to a channel length that is approximately equal to the current technology minimum channel length that is allowed by the by the design rules of a specific processing technology generation, whereas the term "long channel" can refer to a channel length that is at least 200 percent greater than the current technology minimum channel length that is allowed by the by the design rules of a specific processing technology generation. For example, in a MOSFET processing technology where "short channel" transistors have a minimum channel length of 45 nanometers, a long channel transistor would have a channel length between approximately greater than 90 nanometers.

For example, the long channel MOSFET device 20 is electrically isolated from the short channel MOSFET device 30 via one of the shallow trench isolation regions 4 that is provided between devices 20, 30. The long channel MOSFET device 20 includes a gate structure 3, 5 that is interposed between a pair of spaced apart source and drain electrodes 16, 18 formed in an active region 2 of a semiconductor substrate 1. The gate structure 3, 5 includes a metal gate electrode 5 that is formed overlying a high-k dielectric (or "high-k") gate oxide layer 3. The high-k gate oxide layer 3 serves as insulator between the gate electrode 5 and a channel 19 that is defined in the active region 2 of the substrate 1 between the source and drain electrodes 16, 18. The length of the channel 19 is equal to the distance between the source and drain electrodes 16, 18. The flow of majority carriers through the channel 19 can be controlled by applying a control voltage ($V_G$) to the gate electrode 5. To explain further, when a gate voltage ($V_G$) is applied to the gate electrode 5, minority carriers in the channel material of the active region 2 are repelled away from the high-k gate oxide layer 3 and majority carriers of the channel material of the active region 2 are attracted towards the high-k gate oxide layer 3. When the gate voltage ($V_G$) exceeds a threshold voltage ($V_{th}$) of the long channel MOSFET device 20, the electrical field that is generated that causes a drive current to flow between the source and drain electrodes 16, 18 along the channel 19. The short channel MOSFET device 30 includes a gate structure 13, 15 that is interposed between a pair of spaced apart source and drain electrodes 16, 18 formed in an active region 22 of a semiconductor substrate 1. The gate structure 13, 15 includes a metal gate electrode 15 that is formed overlying a high-k dielectric (or "high-k") gate oxide layer 13 that serves as insulator between the gate electrode 15 and a channel 21 that is defined in the active region 22 of the substrate 1 between the source and drain electrodes 16, 18. The length of the channel 21 is equal to the distance between the source and drain electrodes 16, 18. The short channel MOSFET device 30 operates in similar manner as the long channel MOSFET device 20.

As mentioned above, the use of a high-k dielectric gate oxide layer can cause oxygen vacancies along the channel which can alter or change the threshold voltage ($V_{th}$) of the MOSFET devices 20, 30. Lateral oxidation can be used to eliminate some of the oxygen vacancies. In particular, lateral oxidation works well with relatively "short channel" PMOS- FET devices, such as short channel MOSFET device 30, because oxygen can diffuse laterally underneath the gate electrode along the relatively "short" length of the channel to uniformly fill most of the oxygen vacancy sites with oxygen. However, the same can not be said for longer channel or "long channel" MOSFET devices, such as MOSFET device 20 and other MOSFETs commonly used in analog integrated circuits. For long channel MOSFET devices, lateral oxidation is not completely effective since oxygen has to diffuse along the channel 19 over a relatively long distance. To explain further, when oxygen is introduced at the edges of the gate structure 3, 5, it is difficult or impossible to diffuse oxygen laterally underneath the gate structure 3, 5 along the entire length of the channel 19. Even assuming that that oxygen can diffuse along the entire length of the channel 19, it is difficult and/or impossible to ensure that the oxygen diffuses in a uniform manner along the entire length of the channel 19 to uniformly fill the oxygen vacancy sites. This results in a non-uniform oxygen vacancy site density along the length of the channel 19 of the long channel MOSFET device 20. This causes variations in the threshold voltage (Vth) along the length of the channel 19 or "channel length dependence" of the threshold voltage (Vth).

Thus, to help ensure that a long channel MOSFET device having a high-dielectric constant (k) gate dielectric has an appropriate threshold voltage, it is desirable to provide an improved long channel MOSFET device with reduced oxygen vacancy sites along the high-dielectric constant (k) gate dielectric and in which the distribution of oxygen vacancy sites is substantially uniform along the entire length of the channel.

Figure 3:
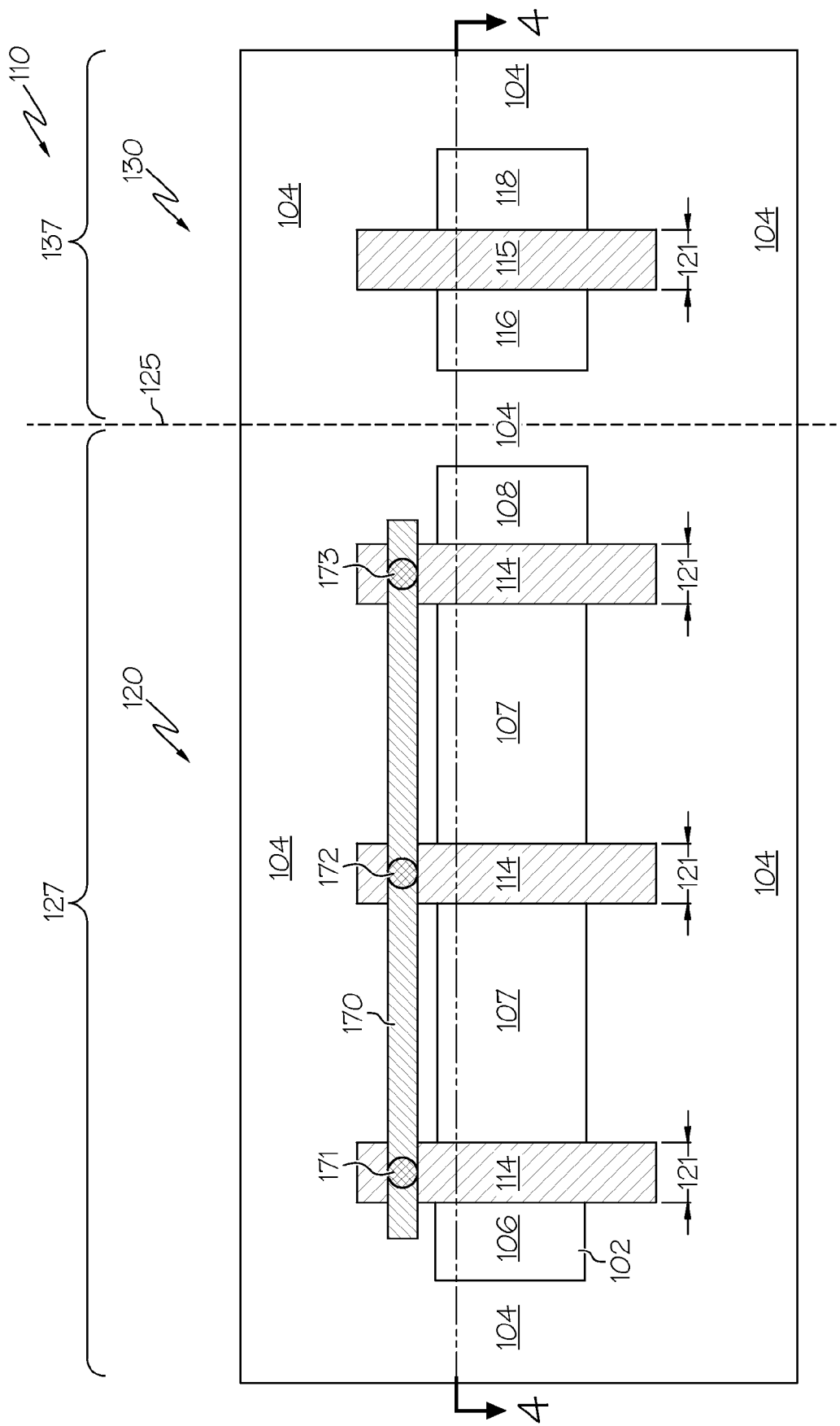
FIG. 3 illustrates, in plan view, a semiconductor circuit including a long channel MOSFET device and a short channel MOSFET device in accordance with various embodiments of the invention.

FIG. 3 illustrates, in plan view, a semiconductor circuit 110 including a long channel MOSFET device 120 and a short channel MOSFET device 130 in accordance with various embodiments of the invention.

The semiconductor circuit 110 includes a long channel MOSFET device 120 and a short channel MOSFET device 130 formed in and on a semiconductor substrate (such as semiconductor substrate 122 illustrated in FIGS. 4-9). The vertical dashed line 125 illustrated in FIG. 3 indicates that the 110 includes two sections 127, 137. The first section 127, to the left of the vertical dashed line 125, includes a portion of the semiconductor substrate 122 that is used to fabricate the long channel MOSFET device 120, whereas the second section 137, to the right of the vertical dashed line 125, includes a portion of the semiconductor substrate 122 that is used to fabricate the short channel MOSFET device 130. The semiconductor substrate includes dielectric isolation regions 104 formed on and within the semiconductor substrate. Openings in the dielectric material used to form the isolation regions 104 define active regions 132, 142 within the substrate of the semiconductor circuit 110. The short channel MOSFET device 130 is located in and on active region 132, and the long channel MOSFET device 120 is located in and on active region 142 defined. The active region 142 is electrically isolated from the active region 132 by an isolation region 104 so that the long channel MOSFET device 120 is electrically isolated from the short channel MOSFET device 130.

The long channel MOSFET device 120 includes a plurality of "minimum geometry" gate electrodes 114, a source region 106 adjacent one of the minimum geometry gate electrodes 114, a drain region 108 adjacent another of the minimum geometry gate electrodes 114, and a plurality of common source/drain regions 107 positioned between adjacent ones of the gate electrodes 114. Each of the gate electrodes 114 have a "minimum geometry" meaning that the gate electrodes 114 have a length dimension 121 that is a minimum length allowed by design rules for a specific MOSFET processing technology generation. While this illustrative embodiment illustrates an exemplary long channel MOSFET device 120 that includes three MOSFETs connected in series with one another, one skilled in the art will appreciate that, depending on the implementation, the long channel MOSFET device 120 can includes less than three or more than three series connected MOS transistors.

The short channel MOSFET device 130 includes a minimum geometry gate electrode 115, a source region 116 adjacent the gate electrode 115, and a drain region 118 adjacent the gate electrode 115. The short channel MOSFET device 130 has a short channel (not illustrated) that is defined in a portion of the active region 142 between the source region 116 and the drain region 118. The channel has a length 121 (or distance between the source region 116 and the drain region 118) that is "short" meaning that the channel length 121 is approximately a minimum channel length that is allowed by design rules for a specific MOSFET processing technology generation.

Figure 7:
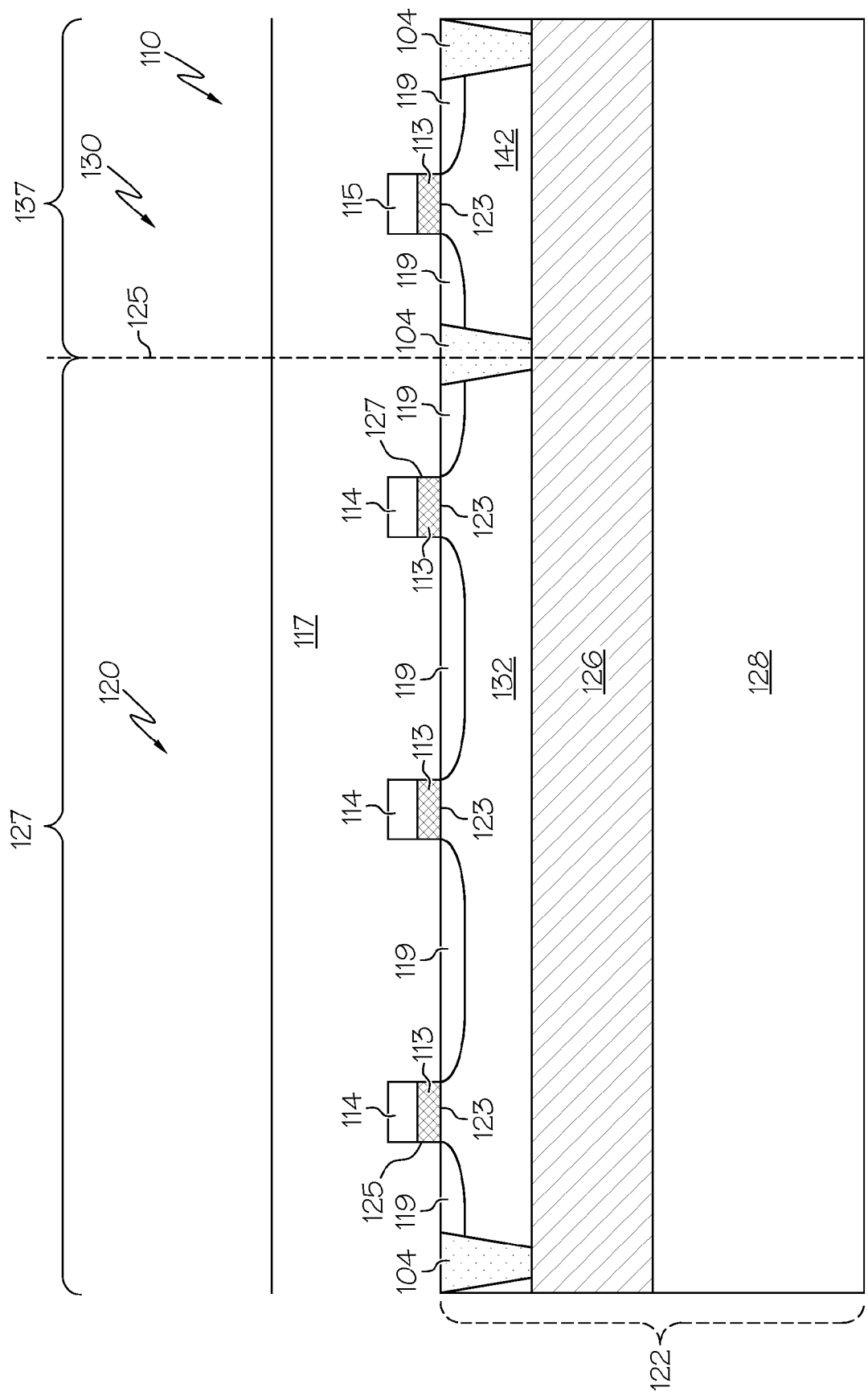
Figure 8:
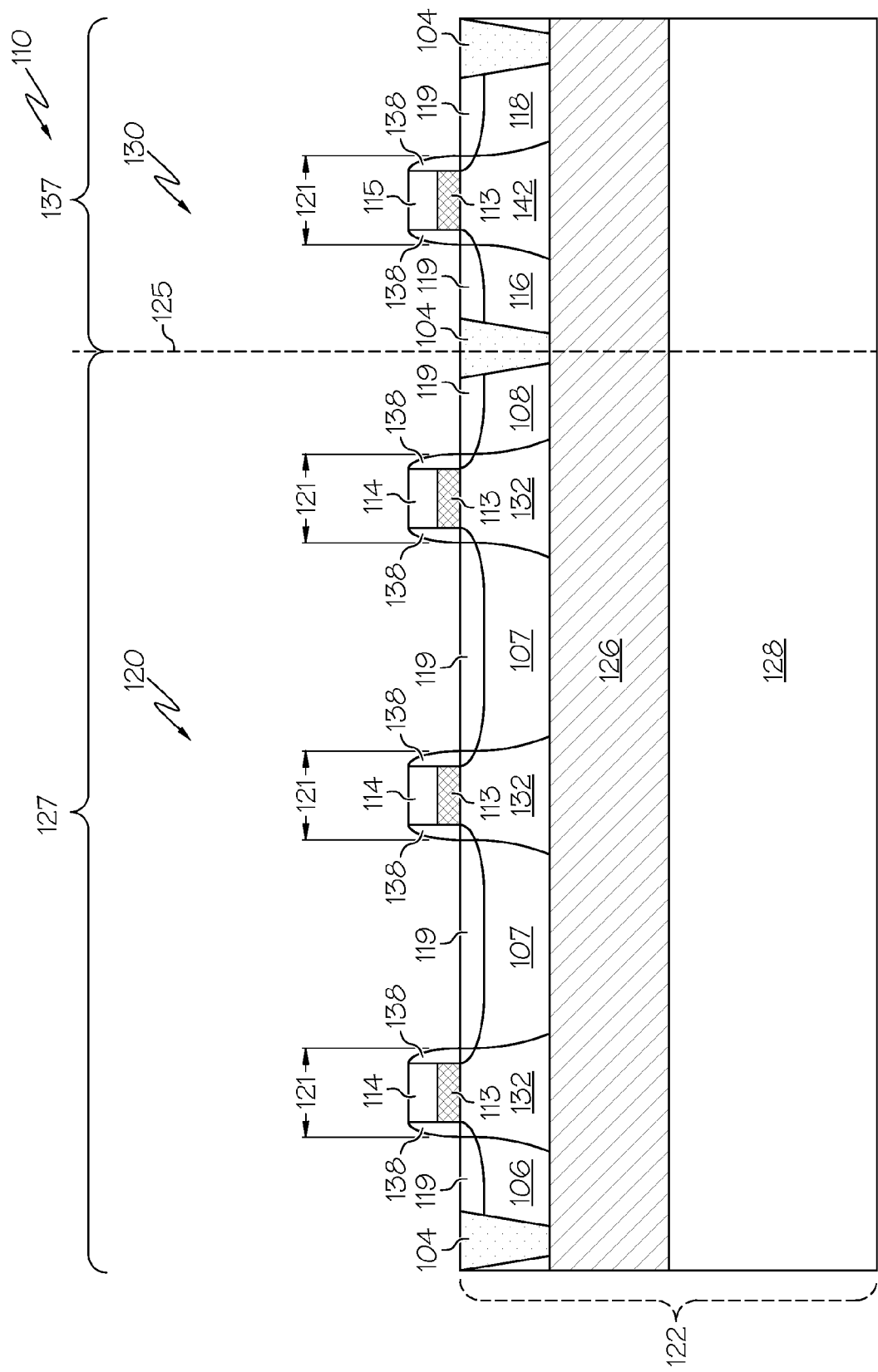
Figure 9:
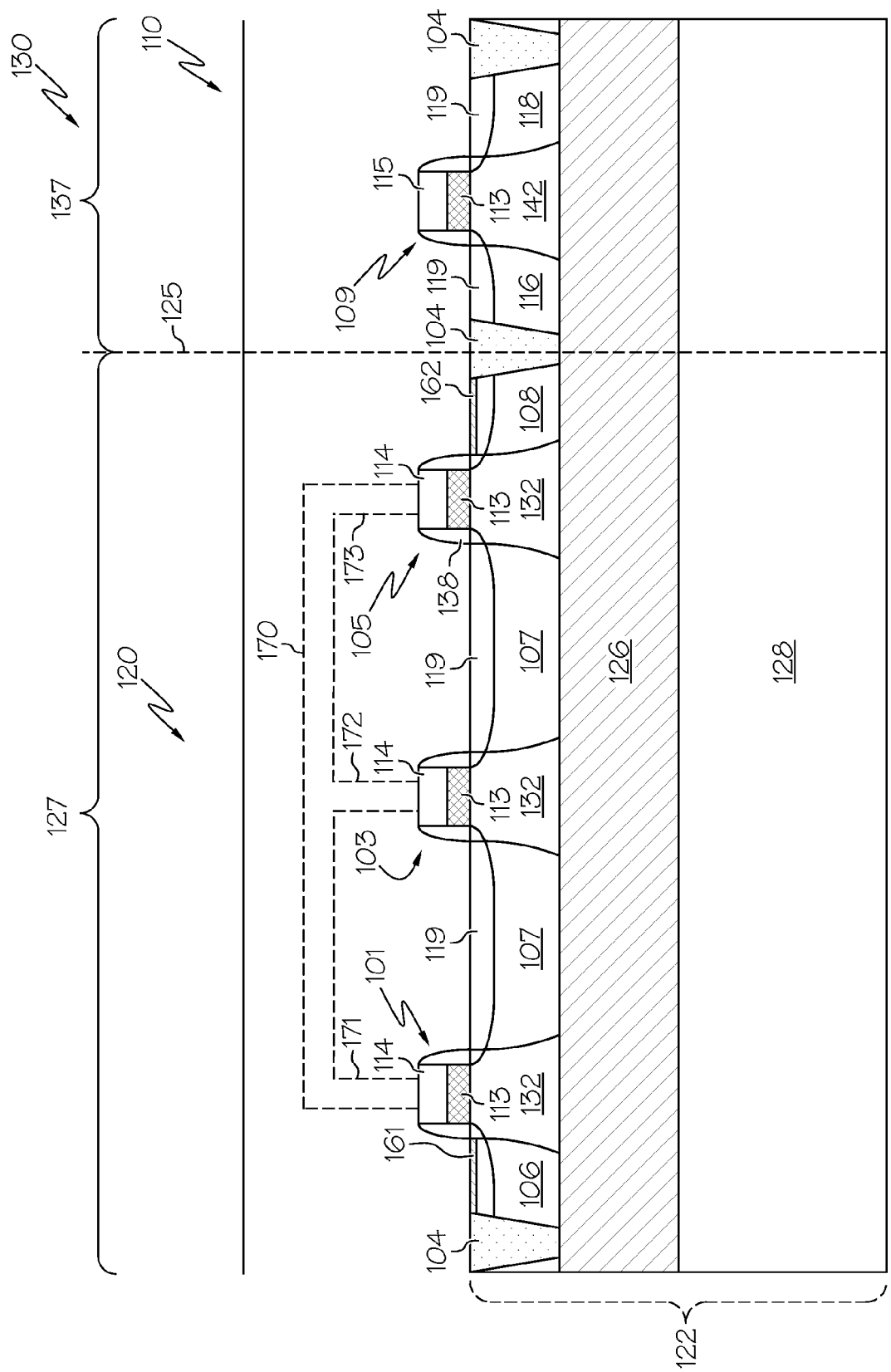

Each of the gate electrodes 114, 115 comprises one or more metal layers that overlie a high-dielectric constant k gate insulator material such as that illustrated, for example, in FIGS. 7-9, as layers 113. The layers 113 serve as insulators between the gate electrodes 114, 115 and the underlying active regions 132, 142.

When connected in a conventional manner, each of the gate electrodes 114 would define a channel (not illustrated) in the active region 132 beneath the gate electrode 114, where each channel has a channel length 121 equal to the distance between its most adjacent source/drain regions and approximately equal to the width or lateral dimension 121 of the gate electrode 114. However, in accordance with embodiments of the present invention, as will be described in detail below, the gate electrodes 114 are electrically coupled together. Because the gate electrodes 114 are electrically coupled together, the long channel MOSFET device 120 has a long channel (not illustrated) defined in the active region 132 with a channel length that is equal to the sum of the channel lengths 121. In other words, each of the gate electrodes 114 define a portion of the long channel of the long channel MOSFET device 120. The channel length is "long" meaning that the channel length is at least 200 percent greater than a minimum channel length 121 that is allowed by design rules for a specific MOSFET processing technology generation.

As illustrated in the embodiment of FIG. 3, each of the gate electrodes 114 are electrically coupled to at least one of the other gate electrodes 114. In accordance with the embodiment illustrated in FIG. 3, the semiconductor circuit 110 includes a conductive gate shorting bar 174 that is electrically coupled to the gate electrodes 114 via one or more conductive vias 171, 172, 173. The conductive gate shorting bar 174 electrically shorts together all of the gate electrodes 114 so that each of the gate electrodes 114 are electrically coupled in series to at least one of the other gate electrodes 114. In one embodiment, the conductive gate shorting bar 174 comprises a conductive layer 174 disposed above the gate electrodes 114. The conductive layer 174 is also coupled to each of the plurality of gate electrodes 114 by one of the conductive via 171, 172, 173.

In comparison to the gate structure 14 of the conventional long channel MOSFET device 20 of FIG. 1, the gate electrodes 114 of long channel MOSFET device 120 are split into multiple (three or more) portions to form a plurality of series connected MOSFET devices. Because the lateral dimensions 121 of the gate electrodes 114 are substantial reduced in comparison to the lateral dimension 19 of the gate electrode 14 of the conventional long channel MOSFET device 20, lateral oxidation is made more effective. As will be described in more detail below with reference to FIGS. 7-9, bottom surfaces 123 of the layers 113 of high-dielectric constant k gate insulator material are in contact with a portion of the respective active regions 132, 142 of the substrate 122. Interfacial layers (not illustrated) are present between the bottom surfaces 123 of the high-dielectric constant k gate insulator material layers 113 and corresponding portions of the respective active regions 132, 142. Because the gate electrodes 114 have a "minimum geometry" along these interfacial layers, the interfacial layers between the active region 142 and the bottom surfaces 123 of high-dielectric constant (k) gate insulator material layers 113 each have a substantially uniform distribution of oxygen along the entire length 121 of the bottom surfaces 123. To explain further, when oxygen is introduced at the edges of the gate structures 114, the oxygen can diffuse laterally in a uniform manner along the entire length of the high-k gate dielectric layers 113 to uniformly fill the oxygen vacancy sites. Oxygen can be introduced from various sources (e.g., STI regions, liner layers, spacer materials, etc.) and can be diffused during any of a number of different processing steps (e.g., annealing or other heating steps, etc.). Because the oxygen vacancy sites in the high-k gate dielectric layers 113 are uniformly filled with oxygen (along the entire length of the channel), the distribution of oxygen vacancy sites in the high-k gate dielectric is substantially uniform (along the entire length of the channel). This not only allows for the threshold voltage (Vth) of the long channel device 120 to be reduced by eliminating oxygen vacancy sites, but also results in a substantially-uniform oxygen vacancy site density along the length of the high-k gate dielectric layers 113. This reduces and/or eliminates variations in the threshold voltage (Vth) or "channel length dependence" of the threshold voltage (Vth).

FIGS. 4-8 and 9 illustrate, in cross section, the semiconductor device 110 of FIG. 3 and method steps for its fabrication in accordance with various embodiments of the invention. In the illustrative embodiments described below, method steps for fabricating an exemplary semiconductor device 110 will be described in which the long channel MOSFET device 120 and the short channel MOSFET device 130 are a long channel PMOSFET device 120 and a short channel PMOSFET device 130, respectively. Those of skill in the art will understand that the semiconductor device 30 can be part of an integrated circuit generally includes a large number of transistors that are interconnected to perform a particular circuit function being implemented. Moreover, similar method steps can be used to manufacture a semiconductor device that includes a long channel NMOSFET device and a short channel NMOSFET device.

Various steps in the manufacture of MOSFET devices are well known and so, in the interest of brevity, many conventional steps will only be mentioned briefly herein or will be omitted entirely without providing the well known process details. As used herein, the term "MOSFET device" refers to a device having a gate electrode and a high-k gate insulator. In many implementations, the gate electrode is formed of one or more metal layers, and can generally refer to any gate electrode comprising one or more metal layers that is positioned overlying a gate insulator comprising one or more high-k materials which, in turn, is positioned overlying a semiconductor substrate (whether silicon or other semiconductor material).

Figure 4:
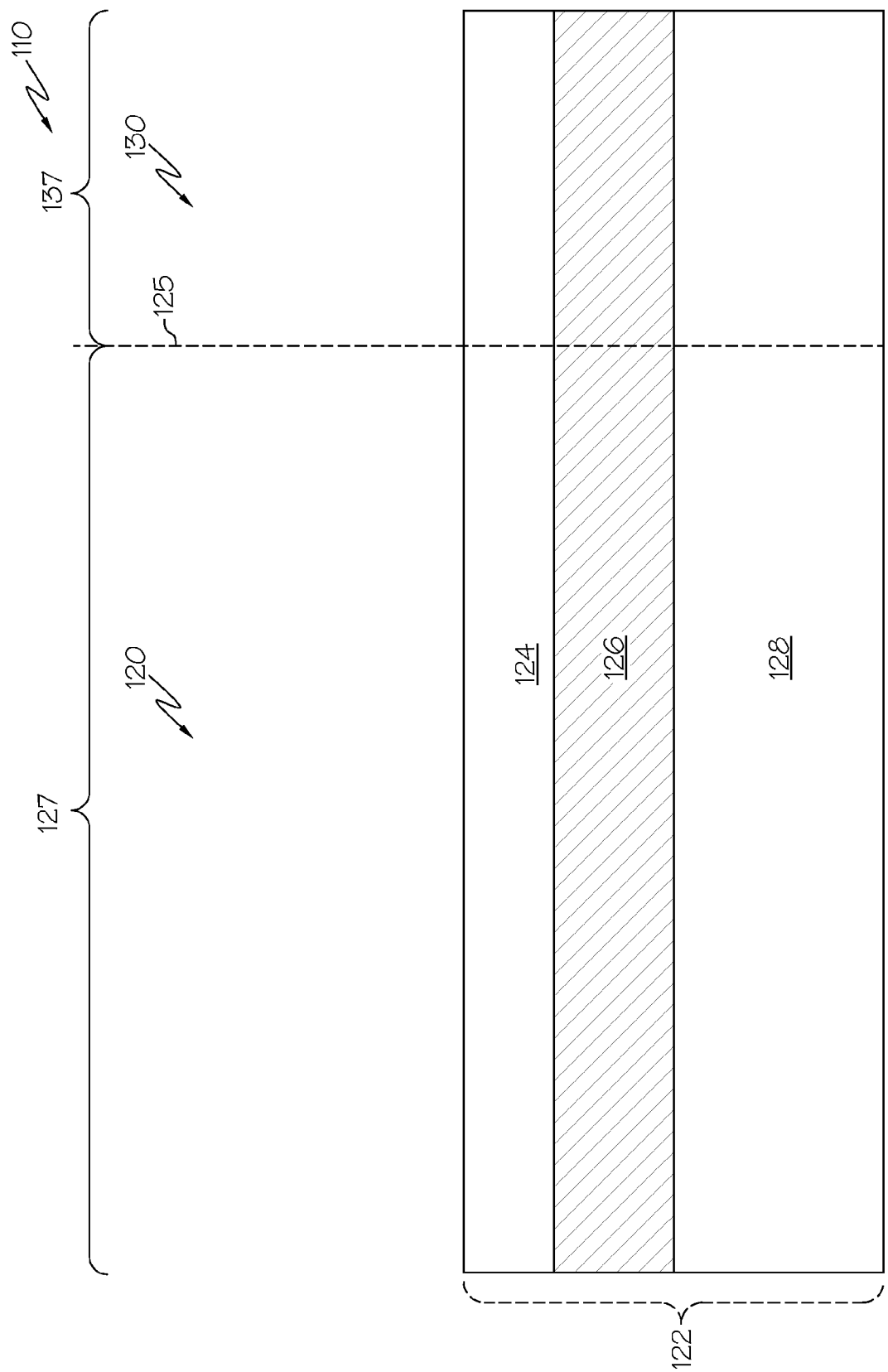
FIGS. 4-8 and 9 illustrate, in cross section, the semiconductor device of FIG. 3 and method steps for its fabrication in accordance with various embodiments of the invention.

As illustrated in FIG. 4, the manufacture in accordance with an embodiment of the invention begins with providing a semiconductor structure 122 in and on which MOS transistors will be fabricated. The semiconductor structure 122 can be either a bulk semiconductor material or a semiconductor-on-insulator (SOI) structure 122 as illustrated in the embodiments of FIGS. 4-9. The SOI structure 122 illustrated in FIG. 4 comprises at least one thin layer of semiconductor material 124 disposed on or overlying a buried oxide insulating layer 126 which, in turn, is supported by a carrier wafer or substrate 128 so that the buried oxide insulating layer 126 is disposed between the carrier wafer 128 and the semiconductor layer 124. The semiconductor layer 124 can be a thin silicon layer, a germanium layer, a silicon germanium layer, a gallium arsenide layer, or other semiconductor materials. In one embodiment, the semiconductor material layer 124 comprises a thin monocrystalline layer of silicon on the buried oxide insulating layer 126. The thin silicon layer may be a relatively pure silicon material, or a layer of silicon material doped with impurity dopant elements such as boron, phosphorus, and arsenic, to form a substantially monocrystalline semiconductor material. In one embodiment, the buried oxide insulating layer 126 can be, for example, a silicon dioxide layer, which preferably has a thickness of about 50-200 nm.

An optional protective oxide layer (not shown) can be deposited overlying the semiconductor layer 124 to protect the semiconductor layer 124 from damage and to help control implantation depth during subsequent implantation steps. In one embodiment, the protective oxide layer (not shown) can be, for example, a silicon dioxide ($SiO_2$) layer, which preferably has a thickness of about 10-20 nm.

Figure 5:
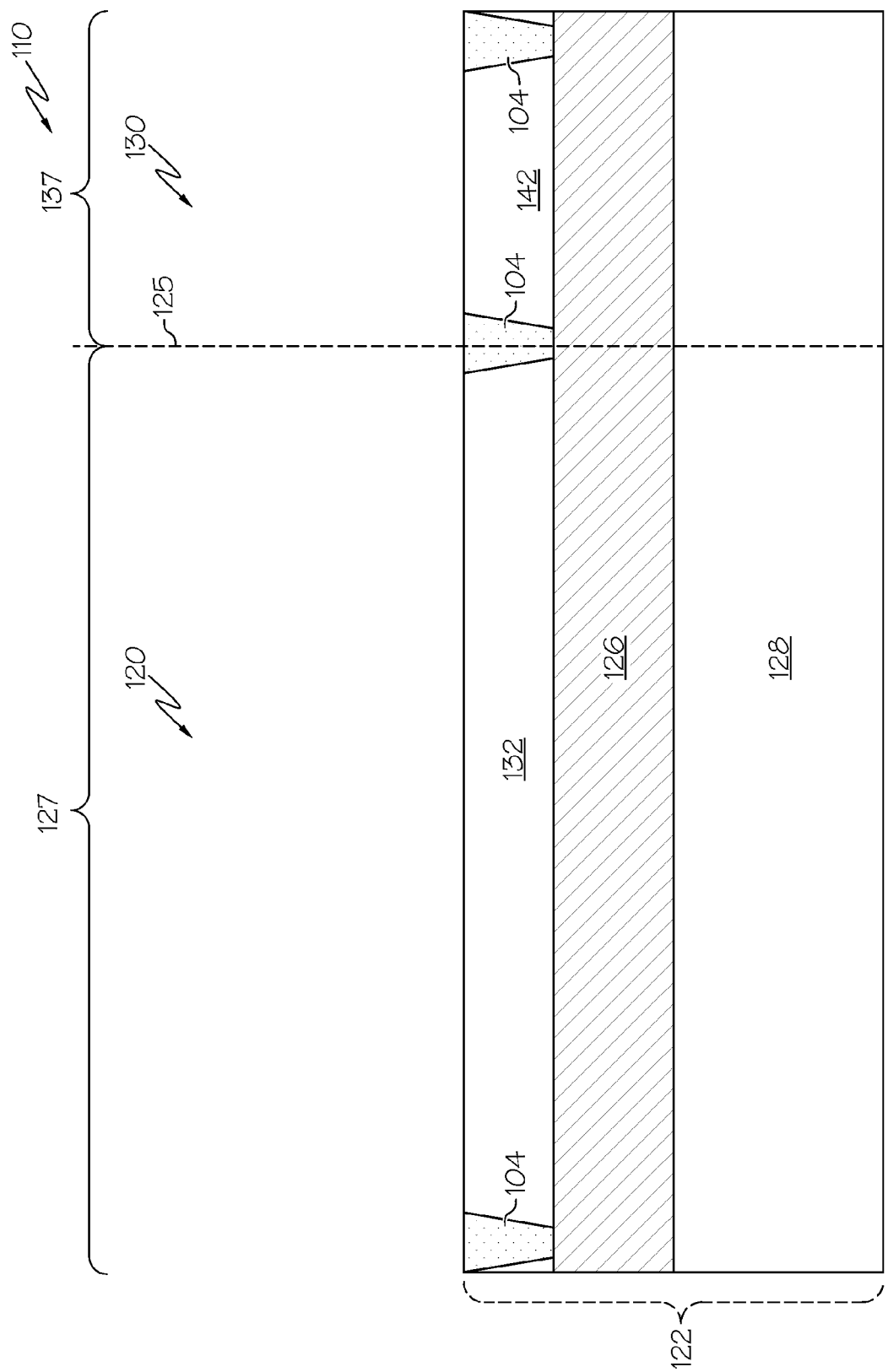

As illustrated in FIG. 5, the semiconductor layer 124 can be impurity doped with N-type conductivity determining impurities to create active N-well regions 132, 142 in the semiconductor layer 124. Impurity doping can take place, for example, by the implantation and subsequent thermal annealing of dopant ions such as phosphorus and arsenic. Once the N-well regions 132, 142 are formed, dielectric isolation regions 104 are formed in the semiconductor layer 124 which are designed to isolate between adjacent MOS transistors 120, 130. There are many known processes that can be used to form the dielectric isolation regions 104, so the process need not be described here in detail. One process for forming the dielectric isolation regions 104 is a shallow trench isolation (STI) process. In general, STI processes involve etching shallow trenches into the surface of the semiconductor layer 124 which are subsequently filled with an insulating material. After the trenches are filled with an insulating material, such as an oxide, the surface is usually planarized, for example by chemical mechanical planarization (CMP).

Figure 6:
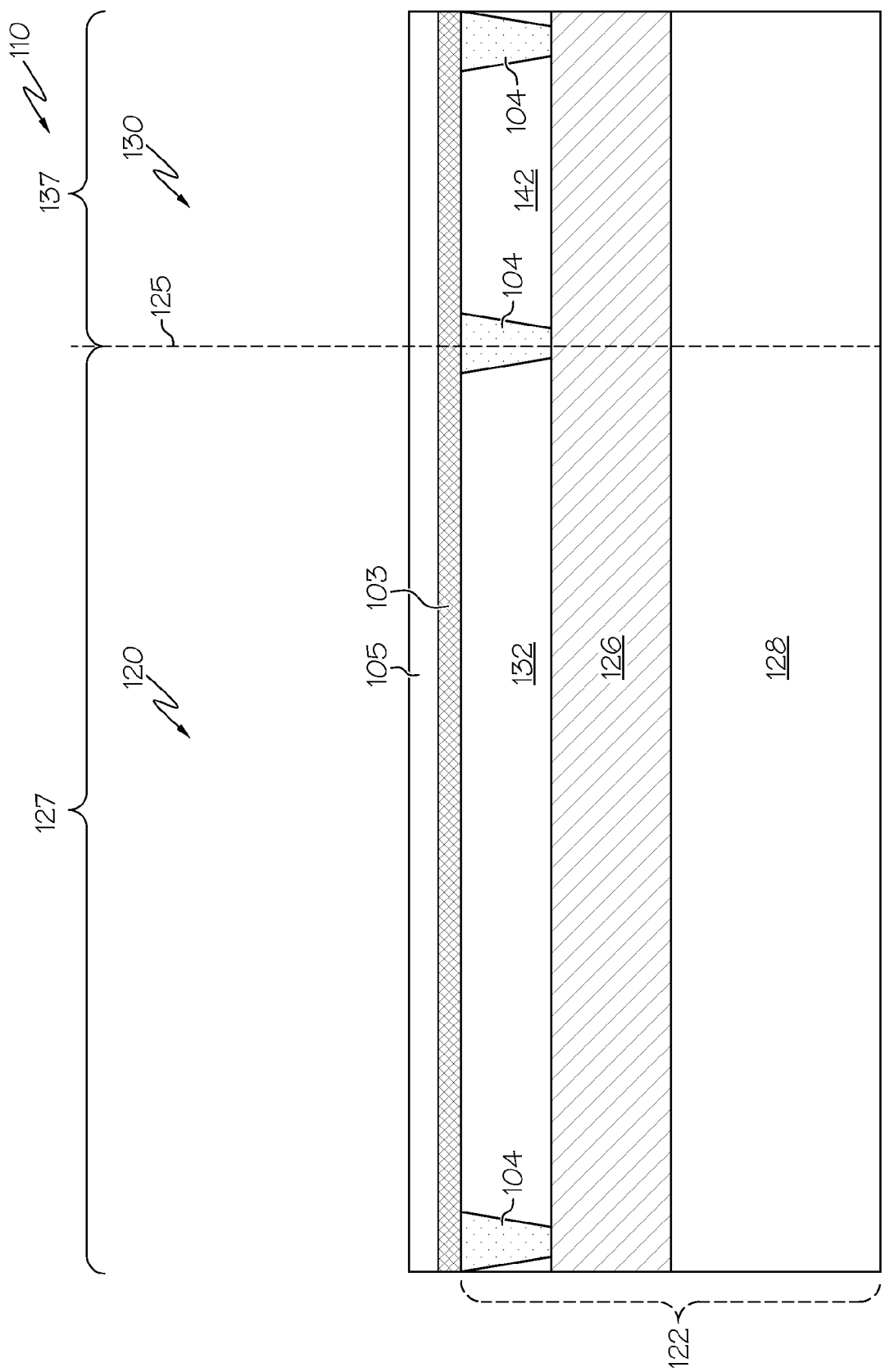

As illustrated in FIG. 6, a layer of high-k gate insulating material 103 is formed overlying the impurity-doped N-well regions 132, 142 and gate electrode material layers 105 are formed overlying the high-k gate insulating material 103 and impurity-doped N-well regions 132, 142, respectively. The layer of high-k gate insulating material 103 is a high dielectric constant (κ) insulator material having a high dielectric constant (κ) relative to silicon dioxide. The high-κ dielectric layer 103 has a κ value of greater than about 4. Examples of "high-κ dielectric" materials include hafnium and zirconium silicates, and their oxides, including, for example, hafnium oxide ($HfO_2$), hafnium silicate (HfSiO). Without limitation, examples of other gate insulating materials include: $HfSiO_4$, HfSiON, $ZrSiO_4$, ZrSiON, and the like, or metal oxides such as $Al_2O_3$, $ZrO_2$, $Y_2O_3$, $La_2O_3$, $TiO_2$, $Ta_2O_5$, and the like. Although not illustrated, in some embodiments, the high-k dielectric layer 103 may have a composite structure with more than one layer, and each layer may be formed of any of the previously discussed materials. Insulators can be deposited, for example, by chemical vapor deposition (CVD), low pressure chemical vapor deposition (LPCVD), plasma enhanced chemical vapor deposition (PECVD) or atomic layer deposition (ALD). The gate electrode material layer 105 can be formed of at least one metal layer 105 overlying the high-k gate insulating material 103. In this PMOSFET embodiment, the particular metal or metals used to form the gate electrode material layer 105 have a high work function, and may comprise high work function metals such as nickel, rhenium, platinum, ruthenium, etc., metal nitrides such as MoN, TaCN, TiAlN, and metal silicides such as $MoSi_2$, HfSi, NiSi, etc. Although not illustrated, in some embodiments, the gate electrode material layer 105 may have a composite structure with more than one layer, and each layer may be formed of any of the previously discussed materials. In one implementation, the gate electrode material layer 105 can also include a capping layer (not shown) that can be made of polycrystalline silicon. The gate electrode material layer or layers 105 can be formed using techniques such as CVD, physical vapor deposition (PVD), sputtering, etc. Although not illustrated in FIG. 6, the metal layer can be doped with impurities to adjust the work function of the metal layer.

As illustrated in FIG. 7, the high-k gate insulating material 103 and gate electrode material layers 105 are patterned and etched to form gate structures 113/114, 113/115. In one embodiment, the gate structures 113/114, 113/115 have a height of approximately 100 nm or less, and a width 121 of approximately 45 nm or less. After the gate structures 113/114, 113/115 have been formed, at least a surface portion of the N-well regions 132, 142 can be impurity doped with P-type conductivity determining impurities to create lightly doped extension regions 119. Impurity doping can take place, for example, by the implantation and subsequent thermal annealing of dopant ions such as boron di-flouride ($BF_2$).

As illustrated in FIG. 8, sidewall spacers 138 are formed on a first sidewall and a second sidewall of the various gate structures 113/114, 113/115. The sidewall spacers 138 are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a $CHF_3$, $CF_4$, or $SF_6$ chemistry. P-type conductivity determining ions such as boron ions are implanted into the each N-well regions 132, 142 and into exposed portions of the gate structures 113/114, 113/115. Implanting P-type conductivity determining ions into the each N-well regions 132, 142 forms P-type source region 106, P-type common or "shared" source/drain regions 107, P-type drain 108 region, P-type source region 116, and P-type drain 118 region that are self aligned with the gate structures 113/114, 113/115.

As illustrated in FIG. 9, an interconnect structure 170 is formed that electrically couples the gate electrodes 114 together. In this embodiment, the interconnect structure 170 can be formed using well-known steps that can include, for example, forming metal silicide contacts (not illustrated) on the gate electrodes 114, depositing interlayer dielectric layers, planarizing the interlayer dielectric layers, and etching contact vias or openings through the dielectric layers to the metal silicide contacts on the gate electrodes 114. Electrical contact to the gate electrodes 114 can then be made by conductive vias 171, 172, 173 formed in contact openings and by deposition of a conductive layer 174 above the gate electrodes 114 and patterning of the conductive layer 174. In this embodiment, the conductive layer 174 is coupled to each of the plurality of gate electrodes 114 by one of the conductive vias 171, 172, 173. The interconnect structure 170 electrically couples each of the gate electrodes 114 in series to at least one of the other gate electrodes 114.

Although the embodiments above with respect to FIGS. 4-9 describe a method for fabricating a semiconductor device 110 in which the long channel MOSFET device 120 and the short channel MOSFET device 130 are a long channel PMOSFET device 120 and a short channel PMOSFET device 130, in alternative embodiments not shown, the similar techniques can be used to fabricate a semiconductor circuit in which the long channel MOSFET device 120 and the short channel MOSFET device 130 are a long channel NMOSFET device 120 and a short channel NMOSFET device 130. In such embodiments, the semiconductor layer can be doped with P-type conductivity determining impurities to create P-well regions (not shown) in the semiconductor layer 124. Impurity doping can take place, for example, by the implantation and subsequent thermal annealing of dopant ions such as boron. In the processing steps described above in FIGS. 4-9 in which P-type conductivity determining impurities are used for doping, in the alternate NMOS embodiments N-type conductivity determining impurities, such as phosphorus or arsenic, can be used as dopants.

Figure 10:
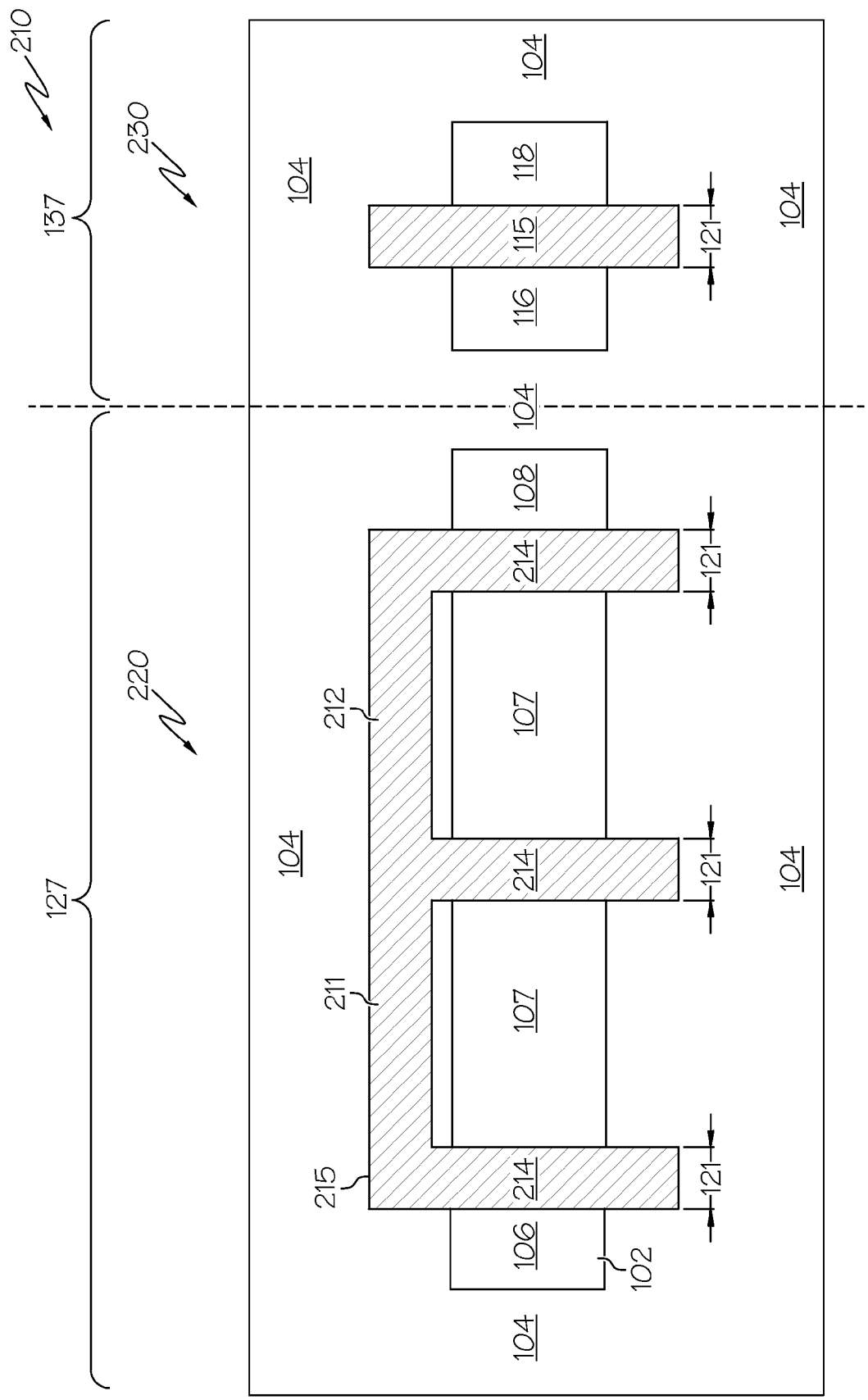
FIG. 10 illustrates, in plan view, a semiconductor circuit including a long channel MOSFET device and a short channel MOSFET device in accordance with other various embodiments of the invention.

FIG. 10 illustrates, in plan view, a semiconductor circuit 210 including a long channel MOSFET device 220 and a short channel MOSFET device 230 in accordance with other various embodiments of the invention. Many of the structural details of the semiconductor circuit 210 of FIG. 10 are similar to those described above with reference to the embodiments of FIG. 3. For sake of brevity, those structural details, and the fabrication steps for creating them, will not be re-described here.

In accordance with the embodiment illustrated in FIG. 10, the semiconductor circuit 210 differs from that illustrated in FIGS. 3-9 in that the semiconductor circuit 210 includes a patterned gate structure that includes a patterned gate electrode layer 215 and patterned high-k gate insulating material layer (not illustrated in FIG. 10). The patterned gate electrode layer 215 that comprises one or more conductive layers, and in one implementation, comprises one or more patterned metal layer(s).

To explain further, when the high-k gate insulating material layers 103 and gate electrode material layers 105 of FIG. 6 are patterned and etched to form gate structures illustrated in FIG. 7, the embodiment illustrated in FIG. 10 utilizes a patterned mask (not illustrated) so that the gate electrode material layers 105 and the underlying high-k gate insulating material layers 103 are patterned in a finger-like formation. This way, the patterned gate electrode layer 215 still includes gate electrode finger portions 214 that correspond to the gate electrodes 114 of FIG. 3; however, each gate electrode finger portion 214 is electrically coupled to its adjacent gate electrode finger portion 214 via an intermediate connection portion 211, 212 which comprises the same gate electrode material layers. Because the intermediate connection portions 211, 212 are fabricated from the same layer or layers used to form the gate electrode finger portions 214, all of the gate electrode finger portions 214 are electrically coupled and shorted together. As such, the need for the interconnect structure 170 (i.e., the conductive gate shorting bar 174 and the conductive vias 171, 172, 173) of FIG. 3 is eliminated.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor circuit, comprising:
   a short channel device; and
   a long channel device electrically isolated from the short channel device, the long channel device comprising:
      a plurality of first gate electrodes each overlying portions of a layer of high-dielectric constant (k) gate insulator material, wherein each of the first gate electrodes are electrically coupled to at least one of the other first gate electrodes;
      a first source region adjacent one of the plurality of first gate electrodes;
      a first drain region adjacent another of the plurality of first gate electrodes; and
      a plurality of common source/drain regions positioned between adjacent ones of the plurality of first gate electrodes.

2. A semiconductor circuit according to claim 1, further comprising:
   a conductive gate shorting bar electrically shorting together all of the first gate electrodes, wherein each of the first gate electrodes are electrically coupled in series to at least one of the other first gate electrodes.

3. A semiconductor circuit according to claim 2, further comprising:
   a plurality of conductive vias each being coupled to one of the plurality of first gate electrodes; and
   wherein the conductive gate shorting bar comprises:
      a first conductive layer disposed above the plurality of first gate electrodes and coupled to each of the plurality of first gate electrodes by one of the plurality of conductive vias.

4. A semiconductor circuit according to claim 1, wherein the plurality of first gate electrodes comprise:
   a plurality of first minimum geometry gate electrodes.

5. A semiconductor circuit according to claim 4, wherein the short channel device comprises:
   a second minimum geometry gate electrode overlying a layer of high-k gate dielectric material;
   a second source region adjacent the second minimum geometry gate electrode; and
   a second drain region adjacent the second minimum geometry gate electrode.

6. A semiconductor circuit according to claim 5, wherein the second minimum geometry gate electrode defines a first channel having a first channel length, wherein each of the plurality of first minimum geometry gate electrodes define a second channel having the first channel length, and wherein each of the first minimum geometry gate electrodes define a portion of a long channel of the long channel device such that the long channel length is equal to the sum of the first channel lengths of the second channels.

7. A semiconductor circuit according to claim 5, wherein the first minimum geometry gate electrodes each define portions of a channel of the long channel device and each have a length dimension that is a minimum length allowed by design rules for a specific MOSFET processing technology generation.

8. A semiconductor circuit according to claim 1, wherein the first gate electrodes comprises a metal layer.

9. A semiconductor circuit according to claim 1, wherein the first gate electrodes are gate electrode finger portions, and further comprising:
   a plurality of intermediate connection portions, wherein each of the intermediate connection portions electrically couple one of the first gate electrodes to an adjacent one of the first gate electrodes.

10. A semiconductor circuit according to claim 9, wherein the first gate electrodes and intermediate connection portions are portions of a patterned gate electrode layer.

11. A semiconductor circuit according to claim 10, wherein the patterned gate electrode layer comprises a plurality of patterned metal layers.

12. A semiconductor circuit according to claim 1, further comprising:
   a substrate comprising:
   a first active region defined within the substrate, wherein the short channel device is located in and on the first active region; and
   a second active region electrically isolated from the first active region by an isolation region, wherein the long channel device is located in and on the second active region, and wherein each of the portions of the layer of high-dielectric constant (k) gate insulator material have a surface in contact with the substrate, wherein the surfaces of each of the portions of the layer of high-dielectric constant (k) gate insulator material have a substantially uniform distribution of oxygen along the entire length of the surfaces.

13. A semiconductor circuit, comprising:
   a semiconductor substrate comprising a first active region and a second active region electrically isolated from the first active region;
   a short channel device located in and on the first active region, the short channel device comprising: a first minimum geometry gate structure comprising: a metal layer overlying a first high-dielectric constant (k) insulator layer comprising oxygen; and
   a long channel device located in and on the second active region, the long channel device comprising:
      a plurality of second minimum geometry gate structures electrically coupled to one another in series, each of the second minimum geometry gate structures comprising: a metal layer overlying a second high-dielectric constant (k) insulator layer comprising oxygen;
      a source region adjacent one of the plurality of second minimum geometry gate structures;
      a drain region adjacent another of the plurality of second minimum geometry gate structures;
      a plurality of common source/drain regions positioned between adjacent ones of the plurality of second minimum geometry gate structures; and
      a first conductive element electrically coupled to each of the plurality of second minimum geometry gate structures, wherein the first conductive element electrically couples each of the second minimum geometry gate structures in series and electrically shorts each of the second minimum geometry gate structures together.

14. A semiconductor circuit according to claim 13, further comprising:
   a plurality of conductive vias each being coupled to one of the plurality of second minimum geometry gate structures, wherein the first conductive element is electrically coupled to each of the plurality of second minimum geometry gate structures by one of the plurality of conductive vias.

15. A semiconductor circuit according to claim 13, wherein the first minimum geometry gate electrode defines a first channel having a first channel length, wherein each of the plurality of second minimum geometry gate electrodes define a second channel having the first channel length, and wherein each of the second minimum geometry gate electrodes define a portion of a long channel of the long channel device such that the long channel length is equal to the sum of the first channel lengths of the second channels.

16. A semiconductor circuit according to claim 13, wherein each of the second minimum geometry gate structures: define portions of a channel of the long channel device, and have a length dimension that is a minimum length allowed by design rules for a specific MOSFET processing technology generation.

17. A semiconductor circuit, comprising:
a semiconductor substrate comprising a first active region and a second active region electrically isolated from the first active region;
a short channel device located in and on the first active region, the short channel device comprising: a first minimum geometry gate structure comprising: a metal layer overlying a first high-dielectric constant (k) insulator layer comprising oxygen; and
a long channel device located in and on the second active region, the long channel device comprising:
a patterned gate structure comprising: a metal layer overlying a second high-dielectric constant (k) insulator layer comprising oxygen, the gate structure comprising: a plurality of interconnected minimum geometry finger portions each being electrically coupled to an adjacent one of the minimum geometry finger portions by an intermediate connection portion;
a source region adjacent one of the plurality of second minimum geometry gate structures;
a drain region adjacent another of the plurality of second minimum geometry gate structures; and
a plurality of common source/drain regions positioned between adjacent ones of the plurality of interconnected minimum geometry finger portions.

18. A semiconductor circuit according to claim 17, wherein the long channel device further comprises:
a channel having a length that is at least 200 percent greater than a minimum channel length that is allowed by design rules for a specific MOSFET processing technology generation, and wherein each of the minimum geometry finger portions have a length dimension that is approximately the minimum channel length allowed by the design rules for the specific MOSFET processing technology generation.

* * * * *